(12) United States Patent
Tsutsumi et al.

(10) Patent No.: US 9,884,960 B2
(45) Date of Patent: *Feb. 6, 2018

(54) WHITE HEAT-CURABLE EPOXY RESIN COMPOSITION, OPTICAL SEMICONDUCTOR ELEMENT CASE MADE OF THE WHITE HEAT-CURABLE EPOXY RESIN COMPOSITION AND OPTICAL SEMICONDUCTOR DEVICE COMPRISED OF THE CASE

(71) Applicant: Shin-Etsu Chemical Co., Ltd., Tokyo (JP)

(72) Inventors: Yoshihiro Tsutsumi, Annaka (JP); Tadashi Tomita, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 118 days.

This patent is subject to a terminal disclaimer.

(21) Appl. No.: 15/044,347

(22) Filed: Feb. 16, 2016

(65) Prior Publication Data

US 2016/0244604 A1    Aug. 25, 2016

(30) Foreign Application Priority Data

Feb. 20, 2015   (JP) .................................. 2015-031488

(51) Int. Cl.

| C08L 63/00 | (2006.01) |
| C08L 53/00 | (2006.01) |
| C08L 33/06 | (2006.01) |
| C08G 59/20 | (2006.01) |
| C08G 59/32 | (2006.01) |
| C08G 59/42 | (2006.01) |
| C08K 3/22 | (2006.01) |
| C08K 9/00 | (2006.01) |
| C08K 13/06 | (2006.01) |
| C08K 3/00 | (2006.01) |
| C08K 3/36 | (2006.01) |
| C08K 5/00 | (2006.01) |
| C08K 5/09 | (2006.01) |
| C08K 5/3447 | (2006.01) |
| C08K 9/02 | (2006.01) |
| H01L 33/56 | (2010.01) |
| H01L 23/06 | (2006.01) |
| H01L 33/60 | (2010.01) |
| C09C 1/00 | (2006.01) |
| C09C 1/36 | (2006.01) |
| C08G 59/18 | (2006.01) |
| C08L 63/06 | (2006.01) |
| H01L 33/00 | (2010.01) |

(52) U.S. Cl.
CPC ............ *C08L 63/00* (2013.01); *C08G 59/186* (2013.01); *C08G 59/3245* (2013.01); *C08G 59/42* (2013.01); *C08L 33/06* (2013.01); *C08L 53/00* (2013.01); *C08L 63/06* (2013.01); *H01L 33/00* (2013.01); *C08K 2003/2241* (2013.01)

(58) Field of Classification Search
CPC .......... C08L 63/00–63/10; C08L 53/00; C08L 33/06; C09D 163/00–163/10; C09D 153/00; C09D 133/06; C09J 163/00–163/10; C09J 153/00; C09J 133/06; C08G 59/42; C08G 59/186; C08G 59/3236; C08G 59/3245; C08K 2003/2241; H01L 33/00

See application file for complete search history.

(56) References Cited

U.S. PATENT DOCUMENTS

| 2008/0187762 A1* | 8/2008 | Hayashi ................. B29C 45/02 428/413 |
| 2015/0210813 A1* | 7/2015 | Arai .......................... C08J 5/24 428/298.7 |

FOREIGN PATENT DOCUMENTS

| EP | 2 196 501 A | 6/2010 |
| JP | 2856336 B2 | 9/1997 |
| JP | 2000-196151 A | 7/2000 |
| JP | 2003-224305 A | 8/2003 |
| JP | 2005-306952 A | 11/2005 |
| JP | 2006-257314 A | 9/2006 |
| JP | 2010-138347 A | 6/2010 |
| JP | 2012-41403 A | 3/2012 |
| JP | 2013-100440 A | 5/2013 |
| JP | 2014-95051 A | 5/2014 |
| WO | WO-2013008680 A1 * | 1/2013 .............. C08L 83/06 |

OTHER PUBLICATIONS

Machine translation of JP 5938040 B.*
Japanese Office Action for Appl. No. 2015-031488 dated Nov. 28, 2017 (w/ English translation).

* cited by examiner

*Primary Examiner* — Kregg T Brooks
(74) *Attorney, Agent, or Firm* — Birch, Stewart, Kolasch & Birch, LLP

(57) ABSTRACT

Provided are a white heat-curable epoxy resin composition having a high strength, high toughness and superior heat resistance; and a semiconductor device whose light receiving and other semiconductor elements are encapsulated by a cured product of such composition. The composition includes:

(A) a prepolymer obtained by heating, melting and mixing components (A-1) triazine derivative epoxy resin, (A-2) acid anhydride and (A-3) acrylic block copolymer so as to react them at an epoxy group equivalent in the component (A-1)/acid anhydride group equivalent of the component (A-2) ratio of 0.6 to 2.0;
(B) a white pigment including at least a titanium oxide;
(C) an inorganic filler;
(D) a curing accelerator; and
(E) an antioxidant.

6 Claims, No Drawings

WHITE HEAT-CURABLE EPOXY RESIN COMPOSITION, OPTICAL SEMICONDUCTOR ELEMENT CASE MADE OF THE WHITE HEAT-CURABLE EPOXY RESIN COMPOSITION AND OPTICAL SEMICONDUCTOR DEVICE COMPRISED OF THE CASE

BACKGROUND OF THE INVENTION

Field of the Invention

The present invention relates to a white heat-curable epoxy resin composition that has a high strength and toughness, and is superior in heat resistance property, an optical semiconductor element case made of the white heat-curable epoxy resin composition and a semiconductor device whose light receiving element and other semiconductor elements are encapsulated by a cured product of such composition.

Background Art

Optical semiconductor elements such as LEDs (Light Emitting Diode) have come into use as various indicators and light sources such as displays on the streets, automobile lamps and residential lightings. Among such LEDs, white LED products are being developed rapidly in various fields under the sloganizing keywords of reduction of carbon dioxide and saving of energies.

As one of materials for semiconductor and electronic devices such as LEDs, a polyphthalamide resin (PPA) has been widely used at present for the material of a photoreflector. Reflector materials using PPA are advantageous in that they have a high strength and flexibility. In recent years, however, as a result of optical semiconductor devices having a progressively higher output and shorter wavelength, PPA has become unadaptable thereto due to a reduction of the optical output being induced by a violent severe deterioration such as a change in color when used around optical semiconductor elements (see JP-A-2006-257314).

JP-B-2656336 discloses an optical semiconductor device using, as an optical semiconductor encapsulating resin, a B-stage epoxy resin composition comprised of an epoxy resin, a curing agent and a curing accelerator, serving as encapsulation resin composition for optical semiconductor elements, and having a cured body of the resin composition in which the foregoing constituents are uniformly mixed on a molecular level. This composition mainly uses a bisphenol A-type epoxy resin or a bisphenol F-type epoxy resin as the epoxy resin. Though JP-B-2656336 also discloses that triglycidyl isocyanate or the like may be used, triglycidyl isocyanate is added in small amounts to the bisphenol type epoxy resin in the working examples, and examinations by the inventors of the present invention show that there has been a problem that such B-stage epoxy resin composition for encapsulating the semiconductor turns yellow particularly when left under a high temperature for a long time.

JP-A-2000-196151 discloses an LED encapsulated by an alicyclic epoxy resin obtained by oxidizing a cyclic olefin. JP-A-2003-224305 discloses an epoxy resin composition for encapsulating a light-emitting element containing a triazine derivative epoxy resin and an acid anhydride curing agent. JP-A-2005-306952 discloses an epoxy resin composition for encapsulating a light-emitting element containing: (A) an epoxy resin containing a hydrogenated epoxy resin, a triazine ring-containing epoxy resin and an alicyclic epoxy resin obtained by epoxidizing a cyclic olefin; and (B) an epoxy resin composition for encapsulating a light-emitting element containing an acid anhydride curing agent. The epoxy resin compositions for encapsulating the light-emitting element of the JP-A-2000-196151, JP-A-2003-224305 and JP-A-2005-306952 also failed to provide sufficient solutions to the problem of yellow discoloration that takes place when left under a high temperature for a long time.

Though JP-A-2000-196151, JP-A-2003-224305 and JP-A-2005-306952 refer to the use of triazine derivative epoxy resins for the epoxy resin compositions for encapsulating a light-emitting element, any of them uses the triazine derivative epoxy resin and an acid anhydride, and there have been pointed out the problem that when they are used as a reflector for LED backlight installed in a modern flat-panel TV, the reflector may be destroyed due to lack of strength and toughness since the reflector is ultraminiaturized and highly reduced in thickness.

In order to solve such problems, there are proposed some epoxy resin compositions for semiconductor in which the acid anhydride is denatured by a linker or an acid anhydride having flexibility is used, as disclosed in JP-A-2013-100440 and JP-A-2014-95051. It has been, however, not possible to realize such composition that satisfies all of the strength, toughness and heat resistance property since a part thus denatured and a framework having a flexibility itself have a comparatively low heat resistance property, as well as a comparatively low reliability with respect to heat or light.

SUMMARY OF THE INVENTION

It is, therefore, an object of the present invention to provide a white heat-curable epoxy resin composition having a high strength, a high toughness, and a superior heat resistance property. It is another object of the present invention to provide an optical semiconductor element case made of the white heat-curable epoxy resin composition. It is a further object of the present invention to provide a semiconductor device whose light receiving element and other semiconductor elements are encapsulated by a cured material of such composition.

As a result of extensive studies on solving the abovementioned problem(s), the inventors of the present invention found that it was possible to attain the objects by a white heat-curable epoxy resin composition, thereby achieving the present invention.

That is to say, the present invention provides the following white heat-curable epoxy resin composition, and a semiconductor device whose light receiving element and other semiconductor elements are encapsulated by a cured product of such composition.

<1>

A white heat-curable epoxy resin composition, having:

(A) a prepolymer obtained by a reaction of components (A-1), (A-2) and (A-3) at an epoxy group equivalent in the component (A-1)/acid anhydride group equivalent of the component (A-2) ratio of 0.6 to 2.0, the component (A-1) being a triazine derivative epoxy resin, the component (A-2) being an acid anhydride, and the component (A-3) being an acrylic block copolymer and added in an amount of 2 to 20 parts by mass with respect to 100 parts by mass of a total sum of the components (A-1) and (A-2);

(B) a white pigment including at least a titanium oxide, the white pigment being in an amount of 3 to 350 parts by mass with respect to the total sum of the components (A-1) and (A-2);

(C) an inorganic filler being in an amount of 80 to 600 parts by mass with respect to 100 parts by mass of the total sum of the components (A-1) and (A-2);

(D) a curing accelerator being in an amount of 0.05 to 5 parts by mass with respect to the total sum of the components (A-1) and (A-2); and (E) an antioxidant being in an amount of 0.01 to 10 parts by mass with respect to the total sum of the components (A-1) and (A-2).

<2>

A white heat-curable epoxy resin composition according to <1>, wherein the titanium oxide of the component (B) is surface treated.

<3>

A white heat-curable epoxy resin composition according to <2>, wherein the titanium oxide is surface treated with at least one of a silica, an alumina, a polyol and an organo-silicon compound.

<4>

A white heat-curable epoxy resin composition according to <1>, wherein the triazine derivative epoxy resin of the component (A-1) is 1,3,5-triazine derivative epoxy resin.

<5>

An optical semiconductor element case made of the white heat-curable epoxy resin composition according to—<1>.

<6>

An optical semiconductor device comprised of the optical semiconductor element case according to <5>.

The present invention is capable of providing a white heat-curable epoxy resin composition having a high strength, a high toughness, and a superior heat resistance property, and a semiconductor device whose light receiving element and other semiconductor elements are encapsulated by a cured product of such composition.

DETAILED DESCRIPTION OF THE INVENTION

A further detailed description of the present invention is presented below.

<Heat-Curable Epoxy Resin Composition for Encapsulating Optical Semiconductor Element>

(A) Prepolymer

A prepolymer as a component (A) is obtained by a reaction of components (A-1), (A-2) and (A-3) at an epoxy group equivalent in the component/acid anhydride group equivalent of the component ratio of 0.6 to 2.0, the component (A-1) being a triazine derivative epoxy resin, the component (A-2) being an acid anhydride curing agent, and the component (A-3) being an acrylic block copolymer.

(A-1) Triazine Derivative Epoxy Resin

The triazine derivative epoxy resin of the component (A-1) used in the present invention is reacted with the acid anhydride of the component (A-2) at a given ratio to obtain a reactant. By containing such reactant as a resin component in the resin composition of the present invention, there can be realized a semiconductor light emitting device exhibiting a restricted yellowing of the cured product of the heat-curable epoxy resin composition, and a small degree of degradation with time.

One favorable example of such triazine derivative epoxy resin is a 1,3,5-triazine nucleus derivative epoxy resin. Especially, an epoxy resin having an isocyanurate ring is superior in a light resistance and electrical insulation, and it is preferred that such epoxy resin be that having a divalent epoxy group, more preferably a trivalent epoxy group with respect to one isocyanurate ring. Specific examples of such epoxy resin include tris (2,3-epoxypropyl) isocyanurate; tris (α-methylglycidyl) isocyanurate and the like.

It is preferred that the triazine derivative epoxy resin of the present invention have a softening point of 40 to 125° C. However, in the present invention, those having hydrogenated triazine rings are not included as the triazine derivative epoxy resin.

(A-2) Acid Anhydride

An acid anhydride as a component (A-2) of the present invention serves as a curing agent, and it is preferred that such acid anhydride be non-aromatic and have no carbon-carbon double bond for the purpose of imparting a light resistance. Specific examples of such acid anhydride include hexahydrophthalic acid anhydride; methylhexahydrophthalic acid anhydride; trialkyltetrahydrophthalic acid anhydride and hydrogenated methylnadic anhydride. Among them hexahydrophthalic acid anhydride and/or methylhexahydrophthalic acid anhydride are preferred. One of these acid anhydride-based curing agents may be used singularly, or two or more kinds of these acid anhydride-based curing agents may be used in combination.

A compounding ratio of the triazine derivative epoxy resin (A-1) to the acid anhydride (A-2) i.e. a ratio of (molar number of all the epoxy groups)/(molar number of the acid anhydride) is 0.6 to 2.0, preferably 0.8 to 2.0, and more preferably 1.0 to 1.8. If this compounding ratio is smaller than 0.6, an unreacted curing agent may remain in the cured product, and a moisture resistance of the cured product obtained may be impaired. In addition, if the compounding ratio is 2.0 or larger, curing failure may occur, and the reliability of the cured product may thus decrease.

(A-3) Acrylic Block Copolymer

For the purpose of increasing strength of the cured product at a room temperature or improving crack resistance, the white heat-curable epoxy resin composition of the present invention contains the acrylic block copolymer as a flexibility imparting agent. The acrylic block copolymer brings about not only the effects of toughening the heat-curable epoxy resin cured product and improving the crack resistance thereof, but also an effect of making it difficult to reduce a light intensity even if the LED is a high-intensity and high-output LED.

The acrylic block copolymer used in the present invention is simultaneously melt and mixed with the triazine derivative epoxy resin (A-1) and the acid anhydride (A-2) when performing a preliminary prepolymerization of the compositions (A-1) and (A-2), thereby obtaining a preferable dispersibility.

The acrylic block copolymer of the component (A-3) is a block copolymer employing an acrylic monomer as an essential monomer component. Examples of such acrylic monomer include a (meth) acrylic acid alkyl ester such as methyl acrylate, ethyl acrylate, n-butyl acrylate, t-butyl acrylate, methyl methacrylate, ethyl methacrylate, n-butyl methacrylate, t-butyl methacrylate and stearyl methacrylate; a (meth) acrylic acid ester having an alicyclic structure, such as cyclohexyl acrylate and cyclohexyl methacrylate; a (meth) acrylic acid ester having an aromatic ring(s), such as benzyl methacrylate; a carboxyl group-containing acrylic monomer having a carboxyl group(s) in the molecules, such as acrylic acid, methacrylic acid and maleic acid; a hydroxyl group-containing acrylic monomer having a hydroxyl group(s) in the molecules, such as 2-hydroxyethyl acrylate, 2-hydroxypropyl acrylate, 4-hydroxybutyl acrylate, 2-hydroxyethyl methacrylate, 2-hydroxypropyl methacrylate, 4-hydroxybutyl methacrylate and a mono (meth) acrylic acid ester of glycerin; an acrylic monomer having an epoxy group(s) in the molecules, such as glycidyl methacrylate, methylglycidyl methacrylate and 3, 4-epoxycyclohexylmethyl methacrylate; an allyl group-containing acrylic monomer having an allyl group(s) in the molecules, such as allyl acrylate and allyl methacrylate; a silane group-containing acrylic monomer having a hydrolyzable silyl group(s) in the molecules, such as γ-methacryloyloxypropyl trimethoxysilane and γ-methacryloyloxypropyl triethoxysilane; and an ultraviolet absorbing acrylic monomer having a benzotriazole-based ultraviolet absorbing group(s), such as 2-(2'-hydroxy-5'-methacryloxyethylphenyl)-2H-benzotriazole.

In addition to the abovementioned acrylic monomers, monomers other than these acrylic monomers may also be used in the acrylic block copolymer of the component (A-3). Examples of monomers other than the aforementioned acrylic monomers include an aromatic vinyl compound such as styrene and α-methylstyrene; a conjugated diene such as butadiene and isoprene; and an olefin such as ethylene and propylene.

The acrylic block copolymer as the component (A-3) can be produced by a known or common method for producing a block copolymer. As a method for producing the abovementioned acrylic block copolymer, living polymerization (e.g. living radical polymerization, living anionic polymerization and living cationic polymerization) is particularly preferred due to an ease of controlling, for example, the molecular weight, molecular weight distribution and terminal end structure of the acrylic block copolymer. Here, such living polymerization can be carried out through a known or common method.

Further, examples of the above acrylic block copolymer include a commercially available product such as "Nanostrength M22N", "Nanostrength M51", "Nanostrength M52", "Nanostrength M52N" and "Nanostrength M53" (all by ARKEMA group, PMMA-b-PBA-b-PMMA); or "Nanostrength E21" and "Nanostrength E41" (all by ARKEMA group, PSt (polystyrene)-b-PBA-b-PMMA).

It is preferred that the acrylic block copolymer as the component (A-3) be added in an amount of 2 to 20 parts by mass, especially 2.5 to 15 parts by mass with respect to 100 parts by mass of a total sum of the components (A-1) and (A-2). If the component (A-3) is added in an amount of smaller than 2 parts by mass, the cured product of the epoxy resin composition may not achieve a desired strength and crack resistance. Meanwhile, an amount of larger than 20 parts by mass may lead to a poor heat and light resistances of the cured product, an extremely slow rate at which curing takes place when performing a molding, and an excessively low glass-transition temperature of the cured product.

When elaborating the aforementioned prepolymer, an epoxy resin(s) other than the component (A-1) can also be used in combination if necessary, in an amount equal to or smaller than a certain amount within the range where the effects of the present invention will not be affected.

Examples of such epoxy resin include a biphenol epoxy resin such as bisphenol A epoxy resin, bisphenol F epoxy resin, 3,3',5,5'-tetramethyl-4,4'-biphenol epoxy resin or 4,4'-biphenol epoxy resin; phenolic novolac epoxy resin, cresol novolac epoxy resin, bisphenol A novolac epoxy resin, naphthalenediol epoxy resin, trisphenylol methane epoxy resin, tetrakisphenylol ethane epoxy resin and epoxy resin whose an aromatic ring of phenol dicyclopentadiene novolac epoxy resin has been hydrogenated or alicyclic epoxy resin. Among these epoxy resins, desired are bisphenol A epoxy resin, bisphenol F epoxy resin, epoxy resin whose aromatic ring has been hydrogenated, alicyclic epoxy resin or silicone-modified epoxy resin, in view of heat resistance and ultraviolet resistance. In addition, it is preferred that the epoxy resins other than the component (A-1) have a softening point of 50 to 100° C. for ease of performing prepolymerization and for improving a handling property.

The aforementioned prepolymer can be obtained by a reaction of the components (A-1), (A-2) and (A-3), for example, at 60 to 120° C., preferably 70 to 110° C., for 4 to 20 hours, more preferably 6 to 15 hours. At that time, an antioxidant as a component (E) may be further added.

In addition, there may be reacted the components (A-1), (A-2), (A-3) and a curing accelerator (D) at 30 to 80° C., preferably 40 to 70° C., for 2 to 12 hours, preferably 3 to 8 hours in advance. At that time, the component (E) may be further added in advance.

In this way, obtained is a prepolymer as a solid product having a softening point of 40 to 100° C., preferably 45 to 70° C. If the softening point of such prepolymer is lower than 40° C., there cannot be obtained a solid. Meanwhile, if the softening point is higher than 100° C., the required fluidity of the composition may become extremely low at the time when molding takes place.

It is preferred that the aforementioned prepolymer be used in the form of a fine powder obtained by comminution or the like when mixed into the composition of the present invention. An average particle diameter of such fine powder is preferably in a range of 5 μm to 3 mm, especially preferably a range of 20 μm to 2 mm. This range is preferred since the component (D) and/or component (E) added in small amounts to the composition can be readily dispersed uniformly in the composition. This average particle diameter is measured as an average cumulative mass D50 (or a median size) through a particle size distribution measurement according to a laser optical diffraction technique.

The composition of the present invention contains component (A) in an amount of preferably 10 to 45% by mass, more preferably 12 to 40% by mass, and further preferably 15 to 35% by mass.

(B) White Pigment

The white heat-curable epoxy resin composition of the present invention contains a white pigment including at least titanium oxide in order to increase a whiteness degree, and the composition is used for a reflector (reflection board) of an optical semiconductor device.

Here, the white pigment is defined as that having a reflection rate of a value greater than or equal to 75% at 450 nm, when added to the heat-curable epoxy resin of the component (A) in an amount of 5% by volume, and that having a reflection rate with a value of less than 75% is regarded as an inorganic filler as a component (C). Examples of such white pigment include a rare-earth oxide represented by titanium oxide and yttrium oxide; a zinc sulfate, a zinc oxide and a magnesium oxide among which a titanium oxide needs to be added invariably in order to further increase the whiteness degree. Titanium oxide may be used singularly, or it may be used in combination with another white pigment(s) so as to make two or more kinds.

The white pigment of the component (B) contains titanium oxide in an amount of preferably greater than or equal to 10% by mass, and more preferably greater than or equal to 14% by mass.

A type of a unit lattice of titanium oxide used as the white pigment of the component (B) may be any one of a rutile type, an anatase type and a brookite type among which the rutile type is preferred. While the average particle diameter and the shape are also not limited, the average particle diameter is normally 0.05 to 3.0 μm, preferably not larger than 1.0 μm, and more preferably not larger than 0.40 This average particle diameter is measured as an average cumulative mass D50 (or a median size) through a particle size distribution measurement according to a laser optical diffraction technique.

In addition, there can be used any titanium oxide which is produced by any methods including, for example, a sulfuric acid method and a chlorine method. However, a titanium oxide produced by the chlorine method is preferred in view of the whiteness degree.

It is preferred that the aforementioned titanium oxide be surface treated with at least one of a silica, an alumina, a polyol and an organosilicon compound in order to increase compatibility with respect to the resin or other inorganic fillers and dispersibility. That is, it is preferred that titanium oxide be surface treated in advance with a hydrous oxide such as an alumina and silica in order to increase the dispersibility of titanium oxide. For the purpose of increasing wettability and compatibility with respect to the epoxy resin, it is preferred that titanium oxide be treated with a polyol. Further, it is preferred that titanium oxide be treated with a organosilicon compound in order to improve an initial reflection rate of the cured product produced from the white heat-curable epoxy resin and increase a fluidity thereof. Examples of the organosilicon compound include chlorosilane; silazane; monomeric organosilicon compound such as a silane coupling agent having a reactive functional group such as an epoxy group and an amino group; and an organopolysiloxane such as a silicone oil and a silicone resin. There may be used other treatment agents such as an organic acid like stearic acid which are normally used for the surface treatment of titanium oxide, the surface treatment may be performed by methods other than those described above, and further a plurality of surface treatments may be performed.

The white pigment is added in an amount of preferably 3 to 350 parts by mass, and more preferably 5 to 300 parts by mass with respect to 100 parts by mass of a total sum of the components (A-1) and (A-2). If the compounded amount of the white pigment is smaller than 3 parts by mass, the whiteness degree may be insufficient. Meanwhile, if the compounded amount of the white pigment is larger than 350 parts by mass, formability of the resin compound may significantly decrease in addition to a decrease in a ratio of other components added for the purpose of improving a mechanical strength of the resin composition. This compounded amount of the white pigment as the component (B) is preferably 1 to 50% by mass with respect to the whole amount of the white heat-curable epoxy resin compound, and more preferably 3 to 40% by mass.

(C) Inorganic Filler

An inorganic filler other than the aforementioned component (B) is further added as the component (C) to the white heat-curable epoxy resin composition of the present invention. As such inorganic filler there can be used those that are normally added to an epoxy resin composition. Examples of such inorganic filler include those of silicas such as a molten silica and a crystalline silica; alumina; silicon nitride; aluminum nitride; boron nitride; antimony trioxide; glass fibers; potassium titanate and the like, but do not include the aforementioned white pigments (white coloring agent) as the component (B). While the average particle diameter and shape of these inorganic fillers are not limited, the average particle diameter is normally larger than 3 μm and not larger than 50 μm. This average particle diameter is measured as an average cumulative mass D50 (or a median size) through a particle size distribution measurement according to a laser optical diffraction technique.

Especially, there are preferably used a silica-based inorganic filler such as a crushed silica and a fused spherical silica, and while the particle size is not specifically limited, the fused spherical silica is preferred in view of formability and fluidity, and the average particle diameter thereof is preferably 4 to 40 μm, and more preferably 7 to 35 μm. In addition, it is preferred that the fillers having a fine particle size of 0.1 to 3 μm, the fillers having a middle particle size of 4 to 8 μm, and the fillers having a coarse particle size of 10 to 50 μm be used in combination in order to further increase the fluidity.

The aforementioned inorganic filler of the component (C) may be surface treated with a coupling agent such as a silane coupling agent and a titanate coupling agent in order to increase a bond strength with the resin component of the component (A) or the white pigment of the component (B), and to achieve a high fluidity of the resin at the time of performing a molding by lowering the viscosity thereof.

Examples of such coupling agents include epoxy functional alkoxysilane such as γ-glycidoxypropyltrimethoxysilane, γ-glycidoxypropylmethyldiethoxysilane, β-(3,4-epoxycyclohexyl)ethyltrimethoxysilane; mercapto functional alkoxysilane such as γ-mercaptopropyltrimethoxysilane. Especially, preferred are the coupling agents other than those that change the color of the fillers treated when left under a temperature of greater than or equal to 150° C. as is the case with an amine-based silane coupling agent. In addition, a compounded amount of the coupling agent used for the surface treatment and a method of the surface treatment are not specifically limited, and they should be performed in accordance with a common method.

It is preferred that the inorganic filler of the component (C) be added in an amount of 80 to 600 parts by mass, especially 200 to 600 parts by mass with respect to 100 parts by mass of a total sum of the components (A-1) and (A-2). If such compounded amount is smaller than 80 parts by mass, the strength may not be sufficient or a burr may be generated at the time of performing molding. Meanwhile, if the compounded amount is greater than 600 parts by mass, a defect such as a peeling of a lead frame may occur due to an increase of a stress by a defect of unfilling or loss of flexibility which are caused by an increase in viscosity. This compounded amount of the inorganic filler of the component (C) is preferably 10 to 90% by mass with respect to the whole amount of the white heat-curable epoxy resin compound, and more preferably 20 to 80% by mass.

(D) Curing Accelerator

The curing accelerator of the component (D) is added as an essential component in order to cure the white heat-curable epoxy resin. The curing accelerator is not specifically limited and those that are publicly known as a curing catalyst of the epoxy resin composition can be used. As the curing accelerator, there can be used at least one of tertiary amines, imidazoles, organic carboxylate thereof, organic carboxylate metal salts, metal-organic chelate compounds, aromatic sulfonium salts, phosphorous curing catalysts such as organic phosphine compounds and phosphonium compounds and salts thereof. Among these compounds, imidazoles, phosphorous curing catalysts, such as 2-ethyl-4-methylimidazole or methyltributylphosphonium dimethylphosphate, and octylic acid salt of tertiary amine are further preferred. In addition, organic acid salt of quaternary phosphonium bromide and amine are preferably used in combination.

As for a used amount of the curing accelerator, it is preferred that the curing accelerator be added in an amount of 0.05 to 5 parts by mass, especially 0.1 to 2 parts by mass with respect to 100 parts by mass of a total sum of the components (A-1) and (A-2). If the used amount is out of the above range, a balance of heat resistance and humidity resistance of the cured product of the epoxy resin composition may become worse, or a curing at the time of performing molding may become extremely slow or fast.

The curing accelerator as the component (D) may also be mixed into the prepolymer of the component (A).

(E) Antioxidant

An antioxidant as a component (E) is added to the white heat-curable epoxy resin composition of the present invention as an essential component for the purpose of improving an initial reflection rate and maintaining a reflection rate in the long term. As such antioxidant of the component (E), there may be used a phenolic antioxidant, a phosphorous antioxidant and a sulfur-based antioxidant. Specific examples of such antioxidant are as follows.

Examples of such phenolic antioxidant include 2,6-di-t-butyl-p-cresol, butylated hydroxyanisole, 2,6-di-t-butyl-p-ethylphenol, stearyl-β-(3,5-di-t-butyl-4-hydroxyphenyl)propionate, 2,2'-methylenebis(4-methyl-6-t-butylphenol), 4,4'-butylidenebis(3-methyl-6-t-butylphenol), 3,9-bis[1,1-dimethyl-2-{β-(3-t-butyl-4-hydroxy-5-methylphenyl)propionyloxy}ethyl]2,4,8,10-tetraoxaspiro[5,5]undecane, 1,1,3-tris(2-methyl-4-hydroxy-5-t-butylphenyl)butane and 1,3,5-trimethyl-2,4,6-tris(3,5-di-t-butyl-4-hydroxybenzyl)benzene Examples of the phosphorous antioxidant include triphenyl phosphite, diphenylalkyl phosphite, phenyldialkyl phosphite, tri(nonylphenyl)phosphite, trilauryl phosphite, trioctadecyl phosphite, distearyl pentaerythritol diphosphite, tris(2,4-di-tert-butylphenyl)phosphite, diisodecyl pentaerythritol diphosphite, di(2,4-di-tert-butylphenyl)pentaerythritol diphosphite, tristearylsorbitol triphosphite and tetrakis(2,4-di-tert-butylphenyl)-4,4'-biphenyl diphosphonate.

Examples of the sulfur-based antioxidant include dilauryl thiopropionate, distearyl thiopropionate, dibenzyl disulfide and trisnonylphenyl phosphite.

One of these antioxidants may be used singularly, or two or more kinds of these antioxidants may be used in combination. It is preferred that the antioxidant be added in an amount of 0.01 to 10 parts by mass, especially 0.03 to 8 parts by mass with respect to a total sum of the components (A-1) and (A-2). If the compounded amount is too small, a color may change due to an insufficient heat resistance, and if the compound amount is too large, sufficient curability and strength may not be achieved due to a curing inhibition.

The antioxidant of the component (E) may be mixed with the prepolymer of the component (A).

The following components may be added to the composition of the present invention in addition to the aforementioned components (A) to (E).

(F) Mold Release Agent

A mold release agent may be added to the white heat-curable epoxy resin composition of the present invention. A mold release agent as a component (F) is added for the purpose of improving a mold releasing property at the time of performing molding.

While as such mold release agent, there are known a natural wax such as carnauba wax, an acid wax, a polyethylene wax and a synthetic wax such as fatty acid ester, when exposed to a high temperature and/or light irradiation, many of them are often susceptible to yellowing and may deteriorate with time such that their mold releasing properties will be lost. Therefore, a glycerin derivative and fatty acid ester which hardly change their color are preferred, and further, there is preferred the carnauba wax which hardly changes its color with the passage of time although it is colored in the early stages.

It is preferred that the mold release agent (F) be added in an amount of 0.05 to 7.0 parts by mass, especially 0.1 to 5.0 parts by mass with respect to a total sum of the components (A-1) and (A-2). If the mold release agent (F) added is in an amount of smaller than 0.05 parts by mass, there may not be achieved a sufficient mold releasing property. Meanwhile, an amount greater than 7.0 parts by mass may lead to a bleeding failure, an adhesion failure or the like.

(G) Coupling Agent

A coupling agent such as a silane coupling agent and a titanate coupling agent may be added to the white heat-curable epoxy resin composition of the present invention for the purpose of improving a bond strength between the resin and the inorganic filler.

Examples of such coupling agent include an epoxy functional alkoxysilane such as γ-glycidoxypropyltrimethoxysilane, γ-glycidoxypropylmethyldiethoxysilane and β-(3,4-epoxycyclohexy)ethyltrimethoxysilane; and a mercapto functional alkoxysilane such as γ-mercaptopropyltrimethoxysilane. However, those causing a thermal resin to discolor when left under a temperature of not lower than 150° C. are not preferable as is the case with an amine-based silane coupling agent. A compounded amount of the coupling agent used for the surface treatment and a method of the surface treatment are not specifically limited, and they should be performed in accordance with a common method.

It is preferred that the component (G) be added in an amount of 0.1 to 8.0 parts by mass, especially 0.5 to 6.0 parts by mass with respect to a total sum of the components (A-1) and (A-2). When the component (G) added is in an amount of smaller than 0.1 parts by mass, an adhesion effect to the base material will be insufficient. Meanwhile, an amount of greater than 8.0 parts by mass may lead to an extremely low viscosity, which can be the cause of voids.

Other Additive Agents

A wide variety of additive agents can be further added to the white heat-curable epoxy resin composition of the present invention as needed. For example, the additive agents such as a silicone powder, a silicone oil, a thermoplastic resin, a thermoplastic elastomer and an organic synthetic rubber can be added in a certain amount or less such that the effects of the present invention are not affected in order to improve the property of the resin.

An example of the manufacturing method of the white heat-curable epoxy resin composition is that the epoxy resin, the white pigment, inorganic filler, the curing catalyst, the antioxidant and other additives are combined with one another at a given composition ratio, and a mixer or the like is then used to mix this combined product to a sufficiently uniform level, followed by melting and mixing the same through a heat roll, a kneader, an extruder or the like, then the product thus obtained is cooled and solidified, followed by crushing the same into pieces of an appropriate size, thus obtaining the molding material of the heat-curable epoxy resin composition. In this method, the epoxy resin is pre-polymerized to be a solid product in view of handling.

Examples of the most common molding method for forming a photoreflector from the white heat-curable epoxy resin composition of the present invention include a transfer molding method and a compression molding method. The transfer molding method requires a transfer molding machine, and it is preferred that the transfer molding be performed under a condition of a molding pressure of 5 to 20 N/mm$^2$, a molding temperature of 120 to 190° C. and a molding time of 30 to 500 sec, especially under a molding temperature of 150 to 185° C. and a molding time of 30 to 180 sec. Meanwhile, the compression molding method requires a compression molding machine, and it is preferred that the compression molding be performed under a molding temperature of 120 to 190° C. and a molding time of 30 to 600 sec, especially under a molding temperature of 130 to 160° C. and a molding time of 120 to 300 sec. In addition, a post curing may be performed at 150 to 185° C. for 0.5 to 20 hours.

The white heat-curable epoxy resin composition of the present invention may be used for encapsulating a normal semiconductor or various modules for automobile use. In such cases, carbon black or the like may be used as a coloring agent. Although any carbon blacks available commercially can be used, those having high purity and not containing a large amount of alkali metal or halogen are desired.

WORKING EXAMPLE

The present invention is described in detail hereunder with reference to working and comparative examples, however, the present invention is not limited to the following working examples.

The materials that were used in the working and comparative examples are as follows.
<(A-1) Triazine Derivative Epoxy Resin>
(A-1-1): Tris (2,3-epoxypropyl) isocyanurate (product name: TEPIC-S by Nissan Chemical Industries, Ltd.)

<(A-2) Acid Anhydride>
(A-2-1): Methylhexahydrophthalic anhydride (product name: RIKACID MH by New Japan Chemical Co., Ltd.)
<(A-3) Acrylic Block Copolymer>
(A-3-1) Acrylic block copolymer (product name: Nanostrength M52N by ARKEMA K.K.)
<(A-4) Other Flexibility Imparting Agent (for the Comparative Examples)>
(A-4-1) Polycarbonate polyol (product name: PLACCEL CD 205 PL by Daicel Corporation)
(A-4-2) Polycaprolactone polyol (product name: PLACCEL 305 by Daicel Corporation)
(A-4-3) 1,4-butanediol (by Wako Pure Chemical Industries, Ltd.)
<(B) White Pigment>
(B-1): Titanium dioxide treated with alumina and having an average particle diameter of 0.21 μm (product name: CR-60 by ISHIHARA SANGYO KAISHA, LTD.)
<(C) Inorganic Filler>
(C-1): Fused spherical silica having an average particle diameter of 10 μm (by Tatsumori Ltd.)

<(D) Curing Accelerator>
(D-1): 1-benzyl-2-phenylimidazole (product name: 1B2PZ by SHIKOKU CHEMICALS CORPORATION)
<(E) Antioxidant>
(E-1): Phosphite antioxidant (product name: PEP-8 by ADEKA CORPORATION)
<(F) Mold Release Agent>
(F-1): Propylene glycol monobehenate (product name: PB-100 by RIKEN VITAMIN CO., LTD.)
<(G) Coupling Agent>
Silane coupling agent: 3-mercaptopropyltrimethoxysilane (product name: KBM-803 by Shin-Etsu Chemical Co., Ltd.)

Example of Synthesis 1

Epoxy Resin Prepolymer (Manufacturing of the Component (A)

The prepolymer of the component (A) was synthesized by combining the components (A-1) to (A-4) whose raw material components are shown in Table 1 at the ratios shown therein, followed by heating, melting and mixing the combined product under the reaction condition shown in Table 1.

TABLE 1

| Compounded amount (parts by mass) | | Prepolymer | | | | | | | |
|---|---|---|---|---|---|---|---|---|---|
| | | A | B | C | D | E | F | G | H |
| (A-1) Epoxy resin | A-1-1 | 43.6 | 43.6 | 47.2 | 47.2 | 43.6 | 43.6 | 43.6 | 43.6 |
| (A-2) Acid anhydride | A-2-1 | 56.4 | 56.4 | 52.8 | 52.8 | 56.4 | 56.4 | 56.4 | 56.4 |
| (A-3) Acrylic block copolymer | A-3-1 | 5.0 | 10.0 | 5.0 | 10.0 | | | | |
| (A-4) Other flexibility | A-4-1 | | | | | 5.0 | | | |
| imparting agent | A-4-2 | | | | | | 5.0 | | |
| | A-4-3 | | | | | | | 5.0 | |
| Epoxy group equivalent/Acid anhydride group equivalent | | 1.3 | 1.3 | 1.5 | 1.5 | 1.3 | 1.3 | 1.3 | 1.3 |
| Reaction condition | | | | | 80° C., 8 hours | | | | |

Working Examples 1 to 4, and Comparative Examples 1 to 6

Each component was added in the compounded amount (parts by mass) shown in Table 2, followed by performing a treatment of melting and mixing the same by two heat rolls. While the heat-curable epoxy resin compositions could be obtained by cooling and crushing the mixed products obtained in the case of working examples 1 to 4 and comparative examples 1 to 4, the heat-curable epoxy resin compositions in paste form were obtained in the case of comparative examples 5 and 6. The following characteristics of these compositions were measured. Table 2 shows the results thereof.
(Spiral Flow Value)
A spiral flow value was measured by using a mold manufactured in accordance with an EMMI standard, under the condition of a molding temperature of 175° C., a molding pressure of 6.9 N/mm² and a molding time of 90 sec.

(Room-Temperature Bending Strength, Room-Temperature Bending Elastic Force and Amount of Deflection)

A mold manufactured in accordance with JIS-K6911 standard was used to perform a molding under the condition of a molding temperature of 175° C., a molding pressure of 6.9 N/mm² and a molding time of 90 sec, followed by performing post curing at 175° C. for an hour. The bending strength, bending elastic force and amount of deflection of the post-cured specimen were measured at a room temperature (25° C.).

(Glass-Transition Temperature (Tg))

A mold manufactured in accordance with EMMI standard was used to perform a molding under the condition of a molding temperature of 175° C., a molding pressure of 6.9 N/mm² and a molding time of 90 sec, followed by performing post curing at 175° C. for an hour. The post-cured specimen was then subjected to a measurement by TMA (TMA 8310 by Rigaku Corporation).

(Optical Reflection Rate (Initial Optical Reflection Rate, Long Term Heat Resistance Test))

A disc-shaped cured product having a diameter of 50 mm and a thickness of 3 mm was formed under the condition of a molding temperature of 175° C., a molding pressure of 6.9 N/mm² and a molding time of 90 sec, followed by using an X-rite 8200 by S.D.G K.K to measure an initial optical reflection rate thereof at 450 nm. And then, the product was subjected to a secondary curing at 175° C. for an hour, and further subjected to a heat treatment at 150° C. for 250 hours or 500 hours, followed by being subjected to a measurement of an optical reflection rate at 450 nm with the aid of the X-rite 8200 by S.D.G K.K. in a similar manner.

As shown in Table 2, it was found that the white heat-curable epoxy resin composition containing the acrylic block copolymer in an amount of the range of the present invention has an improved strength and amount of deflection, thereby having a high toughness as a resin. In addition, in contrast to other flexibility imparting agent, the composition did not exhibit an enormous decrease of the glass-transition temperature and a remarkable reduction of the reflection rate during the long term heat resistance test even when the acrylic block copolymer is added.

Further, from the results of the comparative examples 5 and 6, it is clear that if the components (A-1) to (A-3) of the present invention are not prepolymerized, the composition is hard to be solidified and the dispersibility of each component worsens.

As discussed above, it could be confirmed that a semiconductor device whose LED reflector is encapsulated by the cured product of the white heat-curable epoxy resin composition of the present invention is effective.

TABLE 2

| | Compounded amount (parts by mass) | | | Working examples | | | | Comparative examples | |
|---|---|---|---|---|---|---|---|---|---|
| | | | | 1 | 2 | 3 | 4 | 1 | 2 |
| (A) | Prepolymer | Prepolymer A | | 105.0 | | | | | |
| | | Prepolymer B | | | 110.0 | | | | |
| | | Prepolymer C | | | | 105.0 | | | |
| | | Prepolymer D | | | | | 110.0 | | |
| | | Prepolymer E | | | | | | 105.0 | |
| | | Prepolymer F | | | | | | | 105.0 |
| | | Prepolymer G | | | | | | | |
| | | Prepolymer H | | | | | | | |
| (A-1) | Epoxy resin | A-1-1 | | | | | | | |
| (A-2) | Acid anhydride | A-2-1 | | | | | | | |
| (A-3) | Acrylic block copolymer | A-3-1 | | | | | | | |
| (B) | White pigment | B-1 | | 100.0 | 100.0 | 100.0 | 100.0 | 100.0 | 100.0 |
| (C) | Inorganic filler | C-1 | | 400.0 | 400.0 | 400.0 | 400.0 | 400.0 | 400.0 |
| (D) | Curing accelerator | D-1 | | 0.5 | 0.5 | 0.5 | 0.5 | 0.5 | 0.5 |
| (E) | Antioxidant | E-1 | | 2.5 | 2.5 | 2.5 | 2.5 | 2.5 | 2.5 |
| (F) | Mold release agent | F-1 | | 1.5 | 1.5 | 1.5 | 1.5 | 1.5 | 1.5 |
| (G) | Coupling agent | G-1 | | 0.5 | 0.5 | 0.5 | 0.5 | 0.5 | 0.5 |
| Evaluation results | Spiral flow value | inch | | 36 | 33 | 30 | 28 | 41 | 31 |
| | Room-temperature bending strength | MPa | | 112 | 129 | 100 | 119 | 86 | 102 |
| | Room-temperature bending elastic force | MPa | | 16400 | 15900 | 17300 | 16400 | 17300 | 16900 |
| | Amount of deflection | mm | | 1.02 | 1.23 | 0.99 | 1.05 | 0.83 | 0.99 |
| | Glass-transition temperature | ° C. | | 158 | 155 | 155 | 152 | 158 | 148 |
| | Reflection rate | Initial rate | % | 95 | 95 | 95 | 94 | 94 | 95 |
| | | 150° C., 250 hours | % | 91 | 90 | 89 | 88 | 82 | 69 |
| | | 150° C., 500 hours | % | 82 | 80 | 81 | 79 | 70 | 59 |

| | Compounded amount (parts by mass) | | | Comparative examples | | | |
|---|---|---|---|---|---|---|---|
| | | | | 3 | 4 | 5 | 6 |
| (A) | Prepolymer | Prepolymer A | | | | | |
| | | Prepolymer B | | | | | |
| | | Prepolymer C | | | | | |
| | | Prepolymer D | | | | | |
| | | Prepolymer E | | | | | |
| | | Prepolymer F | | | | | |
| | | Prepolymer G | | 105.0 | | | |
| | | Prepolymer H | | | 100.0 | | |
| (A-1) | Epoxy resin | A-1-1 | | | | 43.6 | 43.6 |
| (A-2) | Acid anhydride | A-2-1 | | | | 56.4 | 56.4 |
| (A-3) | Acrylic block copolymer | A-3-1 | | | | | 5.0 |

TABLE 2-continued

| | | | | | | | |
|---|---|---|---|---|---|---|---|
| (B) | White pigment | | B-1 | 100.0 | 100.0 | 100.0 | 100.0 |
| (C) | Inorganic filler | | C-1 | 400.0 | 400.0 | 400.0 | 400.0 |
| (D) | Curing accelerator | | D-1 | 0.5 | 0.5 | 0.5 | 0.5 |
| (E) | Antioxidant | | E-1 | 2.5 | 2.5 | 2.5 | 2.5 |
| (F) | Mold release agent | | F-1 | 1.5 | 1.5 | 1.5 | 1.5 |
| (G) | Coupling agent | | G-1 | 0.5 | 0.5 | 0.5 | 0.5 |
| Evaluation results | Spiral flow value | | inch | 50 | 35 | 78 | 80 |
| | Room-temperature bending strength | | MPa | 85 | 85 | 42 | 38 |
| | Room-temperature bending elastic force | | MPa | 17400 | 17000 | 14800 | 15800 |
| | Amount of deflection | | mm | 0.86 | 0.82 | 0.51 | 0.42 |
| | Glass-transition temperature | | °C. | 140 | 160 | 160 | 160 |
| | Reflection rate | Initial rate | % | 92 | 95 | 95 | 93 |
| | | 150° C., 250 hours | % | 61 | 91 | 86 | 85 |
| | | 150° C., 500 hours | % | 50 | 82 | 76 | 73 |

What is claimed:

1. A white heat-curable epoxy resin composition comprising:

(A) a prepolymer obtained by a reaction of components (A-1), (A-2) and (A-3) at an epoxy group equivalent in the component (A-1)/acid anhydride group equivalent of the component (A-2) ratio of 0.6 to 2.0, the component (A-1) being a triazine derivative epoxy resin having a triazine or isocyanurate nucleus and three epoxy groups, the component (A-2) being an acid anhydride, and the component (A-3) being an acrylic block copolymer and added in an amount of 2 to 20 parts by mass with respect to 100 parts by mass of a total sum of the components (A-1) and (A-2);

(B) a white pigment including at least a titanium oxide, the white pigment being in an amount of 3 to 350 parts by mass with respect to the total sum of the components (A-1) and (A-2);

(C) an inorganic filler being in an amount of 80 to 600 parts by mass with respect to 100 parts by mass of the total sum of the components (A-1) and (A-2);

(D) a curing accelerator being in an amount of 0.05 to 5 parts by mass with respect to the total sum of the components (A-1) and (A-2); and (E) an antioxidant being in an amount of 0.01 to 10 parts by mass with respect to the total sum of the components (A-1) and (A-2).

2. The white heat-curable epoxy resin composition according to claim 1, wherein the titanium oxide of the component (B) is surface treated.

3. The white heat-curable epoxy resin composition according to claim 2, wherein the titanium oxide is surface treated with at least one of a silica, an alumina, a polyol and an organosilicon compound.

4. The white heat-curable epoxy resin composition according to claim 1, wherein the triazine derivative epoxy resin of the component (A-1) is 1,3,5-triazine derivative epoxy resin.

5. An optical semiconductor element case made of the white heat-curable epoxy resin composition according to claim 1.

6. An optical semiconductor device comprised of the optical semiconductor element case according to claim 5.

* * * * *